(12) United States Patent
Han et al.

(10) Patent No.: US 12,408,353 B2
(45) Date of Patent: Sep. 2, 2025

(54) DEVICE WITH DIELECTRIC METAL OXIDE LAYERS AND SEMICONDUCTOR APPARATUS INCLUDING THE SAME

(71) Applicant: Samsung Electronics Co., Ltd., Suwon-si (KR)

(72) Inventors: Narae Han, Suwon-si (KR); Jeonggyu Song, Seongnam-si (KR); Yongsung Kim, Suwon-si (KR); Jooho Lee, Hwaseong-si (KR); Eunae Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 863 days.

(21) Appl. No.: 17/552,680

(22) Filed: Dec. 16, 2021

(65) Prior Publication Data
US 2023/0058762 A1 Feb. 23, 2023

(30) Foreign Application Priority Data
Aug. 23, 2021 (KR) .................. 10-2021-0111205

(51) Int. Cl.
*H10D 1/68* (2025.01)
*H10B 12/00* (2023.01)
*H10D 84/40* (2025.01)

(52) U.S. Cl.
CPC .......... *H10D 1/692* (2025.01); *H10B 12/315* (2023.02); *H10D 84/403* (2025.01); *H10B 12/34* (2023.02)

(58) Field of Classification Search
CPC ..... H01L 28/60; H01L 27/0635; H01L 28/56; H01L 28/55; H01L 28/57; H10B 12/315; H10B 12/34; H10B 12/30; H10B 12/31; H10D 1/60; H10D 1/62; H10D 1/64; H10D 1/55; H10D 1/665; H10D 1/68; H10D 1/682; H10D 1/684; H10D 1/692; H10D 1/694; H10D 1/696; H10D 1/711;
(Continued)

(56) References Cited

U.S. PATENT DOCUMENTS 7,518,178 B2 4/2009 Takashima et al.
9,876,067 B2 1/2018 Shimoda et al.
(Continued)

FOREIGN PATENT DOCUMENTS

JP 4768427 B2 9/2011
KR 10-0798735 B1 1/2008
(Continued)

OTHER PUBLICATIONS

Notice of Non-Final Rejection issued Nov. 27, 2023 in Korean Application No. 10-2021-0111205.

*Primary Examiner* — John P. Dulka
(74) *Attorney, Agent, or Firm* — Harness, Dickey & Pierce, P.L.C.

(57) ABSTRACT

Provided are a semiconductor device and a semiconductor apparatus including the same, the semiconductor device including: a first electrode; a second electrode apart from the first electrode; a dielectric structure provided between the first electrode and the second electrode and including a dielectric layer including a metal oxide represented by $M_xO_y$; and a leakage current reducing layer including a metal oxide represented by $La_y'M'_y'O_{z'}$.

16 Claims, 9 Drawing Sheets

(58) Field of Classification Search
CPC ........ H10D 1/712; H10D 1/714; H10D 1/716; H10D 84/403; H10D 84/406; H10D 84/409
See application file for complete search history.

(56) References Cited

U.S. PATENT DOCUMENTS

| | | | |
|---|---|---|---|
| 2005/0063141 A1* | 3/2005 | Jeong | .................... H01L 28/40 361/312 |
| 2013/0171797 A1 | 7/2013 | Park et al. | |
| 2014/0080282 A1* | 3/2014 | Chiang | .................. H01L 28/40 257/E21.011 |
| 2021/0265458 A1 | 8/2021 | Song et al. | |
| 2022/0140067 A1 | 5/2022 | Song et al. | |
| 2023/0035431 A1* | 2/2023 | Do | .......................... H01G 4/33 |

FOREIGN PATENT DOCUMENTS

| | | |
|---|---|---|
| KR | 10-2013-0078965 A | 7/2013 |
| KR | 10-2183760 B1 | 11/2020 |
| KR | 10-2022-0059878 | 5/2022 |

\* cited by examiner

DEVICE WITH DIELECTRIC METAL OXIDE
LAYERS AND SEMICONDUCTOR
APPARATUS INCLUDING THE SAME

CROSS-REFERENCE TO RELATED APPLICATION

This application is based on and claims priority under 35 U.S.C. § 119 to Korean Patent Application No. 10-2021-0111205, filed on Aug. 23, 2021, in the Korean Intellectual Property Office, the disclosure of which is incorporated by reference herein in its entirety.

BACKGROUND

1. Field

The disclosure relates to a semiconductor device and a semiconductor apparatus including the same.

2. Description of the Related Art

As electronic devices are down-scaled, the available space to be occupied by electronic components, such as semiconductor devices, in electronic devices has also been reduced. Accordingly, along with the reduction in size of an electronic component and/or semiconductor device, such as a capacitor, a reduction in thickness of a dielectric layer of the capacitor is also required. However, in this case, a large leakage current may occur through the dielectric layer of the capacitor, thereby making it difficult to drive the electronic component and/or semiconductor device.

SUMMARY

Provided are electronic components having a low leakage current and high capacitance, and semiconductor apparatuses including the same.

Additional aspects will be set forth in part in the description which follows and, in part, will be apparent from the description, or may be learned by practice of the presented example embodiments of the disclosure.

According to an aspect of an embodiment, an electronic component includes: a first electrode; a second electrode apart from the first electrode; and a dielectric structure between the first electrode and the second electrode, the dielectric structure including a dielectric layer including a metal oxide represented by MxOy, where M is at least one of Ca, Sr, Ba, Sc, Y, Ti, Zr, Hf, Nb, Ta, Ce, Pr, Nd, Gd, Dy, Yb, and Lu, and a leakage current reducing layer including a metal oxide represented by La$_x$'M'$_y$'O$_z$', where M'is at least one of Ca, Sr, Ba, Sc, Y, Ti, Zr, Hf, Nb, Ta, Ce, Pr, Nd, Gd, Dy, Yb, and Lu).

The dielectric layer may include first and second dielectric layers, and the leakage current reducing layer may be between the first dielectric layer and the second dielectric layer.

The leakage current reducing layer may be between the first electrode and the dielectric layer.

The leakage current reducing layer may be between the second electrode and the dielectric layer.

A thickness of the leakage current reducing layer may be 0.1 Å or more and 4.5 Å or less.

A total thickness of the dielectric structure may be 50 Å or less.

The dielectric layer may have a single-layer structure or a multi-layer structure in which different materials are stacked.

The first and second electrodes may each independently include a metal, a metal nitride, a metal oxide, or a combination thereof.

One of the first and second electrodes may include a semiconductor material.

According to an aspect of another embodiment, a semiconductor apparatus includes: a field effect transistor; and a capacitor electrically connected to the field effect transistor. The capacitor includes a first electrode; a second electrode apart from the first electrode; a dielectric structure between the first electrode and the second electrode, the dielectric structure including a dielectric layer including a metal oxide represented by MxOy, where M is at least one of Ca, Sr, Ba, Sc, Y, Ti, Zr, Hf, Nb, Ta, Ce, Pr, Nd, Gd, Dy, Yb, and Lu, and a leakage current reducing layer including a metal oxide represented by La$_x$ M'$_y$ O$_z$, where M' is at least one of Ca, Sr, Ba, Sc, Y, Ti, Zr, Hf, Nb, Ta, Ce, Pr, Nd, Gd, Dy, Yb, and Lu.

The field effect transistor may include a channel layer between a source and a drain; a dielectric layer on the channel layer; and a gate electrode on the dielectric layer.

The dielectric layer may include first and second dielectric layers, and the leakage current reducing layer may be between the first dielectric layer and the second dielectric layer.

The leakage current reducing layer may be between the dielectric layer and at least one of the first electrode or the second electrode.

A thickness of the leakage current reducing layer may be 0.1 Å or more and 4.5 Å or less.

A total thickness of the dielectric structure may be 50 Å or less.

The first and second electrodes may each independently include a metal, a metal nitride, a metal oxide, or a combination thereof.

According to an aspect of another embodiment, an electronic device includes the above-described semiconductor apparatus.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
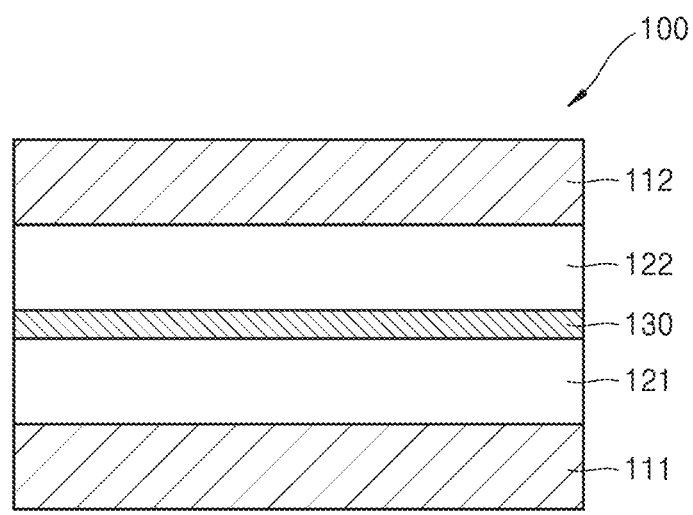
FIG. 1 is a cross-sectional view of an electronic component according to some example embodiments.

Reference will now be made in detail to some embodiments, examples of which are illustrated in the accompanying drawings, wherein like reference numerals refer to like elements throughout. In the drawings, the sizes of constituent elements may be exaggerated for clarity. The embodiments described below are only examples, and thus, it should be understood that the embodiments may be modified in various forms. In this regard, the present embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, an expression such as "above" or "on" may include not only the meaning of "immediately on/under/to the left/to the right in a contact manner", but also the meaning of "on/under/to the left/to the right in a non-contact manner". Additionally, device may be otherwise oriented (rotated 90 degrees or at other orientations) and the spatially relative descriptors used herein interpreted accordingly. As used herein, the singular forms "a," "an," and "the" are intended to include the plural forms as well, unless the context clearly indicates otherwise. In addition, it will be understood that when a unit is referred to as "comprising" another element, it does not preclude the possibility that one or more other elements may exist or may be added.

When the terms "about" or "substantially" are used in this specification in connection with a numerical value, it is intended that the associated numerical value includes a manufacturing tolerance (e.g., ±10%) around the stated numerical value. Further, regardless of whether numerical values or shapes are modified as "about" or "substantially," it will be understood that these values and shapes should be construed as including a manufacturing or operational tolerance (e.g., ±10%) around the stated numerical values or shapes.

It will be understood that, although the terms "first," "second," "third", etc. may be used herein to describe various elements, these elements should not be limited by these terms. These terms are used only to differentiate an element from another element, and the order and type of the elements are not limited thereto. Unless explicitly stated or contradicted to the order of operations constituting the method, these operations may be performed in an appropriate order and are not necessarily limited to the order described. In addition, the terms "-er", "-or", and "module" described in the specification mean units for processing at least one function and/or operation and can be implemented by hardware components, software components, and/or combinations thereof. For example, the processing units may include and/or be included in, but are not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc.

The connecting lines, or connectors shown in the various figures presented are intended to represent example functional relationships and/or physical or logical couplings between the various elements. It should be noted that many alternative or additional functional relationships, physical connections or logical connections may be present in a practical device.

The use of any and all examples, or exemplary language (e.g., "such as") provided herein, is intended merely to better illuminate the inventive concepts, and does not pose a limitation on the scope of the inventive concepts unless otherwise claimed.

According to an aspect, an electronic component having a small leakage current and high capacitance may be provided.

FIG. 1 is a cross-sectional view illustrating an electronic 100 according to some example embodiments. The electronic component 100 shown in FIG. 1 may be semiconductor device and/or a capacitor.

Referring to FIG. 1, first and second electrodes 111 and 112 are provided to be apart from each other, and first and second dielectric layers 121 and 122 are provided on the first and second electrodes 111 and 112, respectively. For example, the first electrode 111, the first dielectric 121, the second dielectric 122, and the second electrode may be sequentially stacked. In addition, a leakage current reducing layer 130 is provided between the first and second dielectric layers 121 and 122.

The first electrode 111, which may be referred to as a lower electrode, may be arranged on a substrate (not shown). The substrate may be a portion of a structure supporting the electronic component 100 (e.g., a capacitor) and/or a portion of a device connected to the electronic component 100. The substrate may include a pattern of semiconductor material, a pattern of insulating material, and/or a pattern of conductive material. The substrate may include, for example, a substrate 11', a gate stack 12, an interlayer insulating layer 15, a contact structure 20', and/or a bit line structure 13 in FIGS. 8 and 9 to be described later below.

The substrate may include, for example, a semiconductor material such as at least one of silicon (Si), germanium (Ge), silicon germanium (SiGe), silicon carbide (SiC), gallium arsenide (GaAs), indium arsenide (InAs), indium phosphide (InP), and/or the like, and/or the substrate may include, for example, an insulating material such as at least one of silicon oxide, silicon nitride, silicon oxynitride, and/or the like.

The second electrode 112, which may be referred to as an upper electrode, may be arranged to face the first electrode 111 while being apart from each other. The first and second electrodes 111 and 112 may each independently include a conductive (and/or semiconductive) material, such as at least one of a metal, a metal nitride, a metal oxide, or a combination thereof. For example, the first and second electrodes 111 and 112 may each independently include a metal (such as ruthenium (Ru), titanium (Ti), tantalum (Ta), niobium (Nb), iridium (Ir), molybdenum (Mo), tungsten (W), platinum (Pt), and/or the like), a conductive metal nitride (such as titanium nitride (TiN), tantalum nitride (TaN), niobium nitride (NbN), molybdenum nitride (MoN), cobalt nitride (CoN), tungsten nitride (WN), and/or the like), and/or a conductive metal oxide (such as platinum oxide (PtO), iridium oxide ($IrO_2$), ruthenium oxide ($RuO_2$), strontium ruthenium oxide ($SrRuO_3$), barium strontium ruthenium oxide (($Ba,Sr)RuO_3$), calcium ruthenium oxide ($CaRuO_3$), lanthanum strontium cobalt oxide (($La,Sr)CoO_3$), and/or the like).

For example, the first and second electrodes 111 and 112 may each independently include a metal nitride represented by MeMe'N, where Me is a metal element, Me' is an element different from Me, and N is nitrogen. This metal nitride may include MeN metal nitride doped with element Me'.

Me may be, for example, one, two, or more elements selected from Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and/or U.

Me' may be, for example, one, two, or more elements selected from H, Li, Be, B, N, O, Na, Mg, Al, Si, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and/or U.

The first and second electrodes 111 and 112 may each independently include a single material layer and/or have a structure in which a plurality of material layers are stacked. For example, the first and/or second electrodes 111 and 112 may be a single layer of titanium nitride (TiN) and/or of niobium nitride (NbN). Alternatively, the first and/or second electrodes 111 and 112 may have a structure in which at least a first electrode layer including titanium nitride (TiN) and a second electrode layer including niobium nitride (NbN) are stacked.

A first dielectric layer 121 is provided on a surface (e.g., an upper surface) of the first electrode 111, and a second dielectric layer 122 is provided on a surface (e.g., a lower surface) of the second electrode 112. The first and second dielectric layers 121 and 122 may include a dielectric material having paraelectric properties. For example, the first and second dielectric layers 121 and 122 may include a dielectric material having a dielectric constant of about 20 or more and/or 70 or less.

In some example embodiments, each of the first and second dielectric layers 121 and 122 may include a metal oxide represented by $M_xO_y$ (x and y are natural numbers), wherein O is oxygen and M may be one metal element selected from Ca, Sr, Ba, Sc, Y, La, Ti, Zr, Hf, Nb, Ta, Ce, Pr, Nd, Gd, Dy, Yb and/or Lu. The first and/or the second dielectric layers 121 and 122 may include dopants. The first and second dielectric layers 121 and 122 may include, but are not limited to, the same metal oxide. For example, the first and second dielectric layers 121 and 122 may include the same and/or different metal oxides. The first and second dielectric layers 121 and 122 may each independently have a single-layer structure including a single material layer or a multi-layer structure in which a plurality of material layers are stacked. The first and second dielectric layers may have the same and/or different thicknesses.

The leakage current reducing layer 130 may be provided between the first and second dielectric layers 121 and 122. The leakage current reducing layer 130 may reduce a leakage current flowing inside the electronic component 100 (e.g., a capacitor). In some example embodiments, the leakage current reducing layer 130 may include a metal oxide represented by $La_x'M_y'O_z'$ (x', y', z' are natural numbers). M' may be one metal element selected from Ca, Sr, Ba, Sc, Y, Ti, Zr, Hf, Nb, Ta, Ce, Pr, Nd, Gd, Dy, Yb and/or Lu.

Such metal oxides may have paraelectric properties. The M in first and/or second dielectric 121 and 122 and the M' in the leakage current reducing layer 130 may be the same and/or different metal elements.

The leakage current reducing layer 130 may have a thickness of about 0.1 Å or more and/or 4.5 Å or less. A total thickness of the first and second dielectric layers 121 and 122 and the leakage current reducing layer 130 may be about 50 Å or less. In some example embodiments, the total thickness of the first and second dielectric layers 121 and 122 and the leakage current reducing layer 130 may be about 40 Å or more and/or 50 Å or less. However, the disclosure is not limited thereto.

In the electronic component 100 (e.g., a capacitor) according to some example embodiments, by providing the leakage current reducing layer 130 including a metal oxide represented by $La_xM_yO_z$ between the first and second dielectric layers 121 and 122, the capacitance may be increased, and a leakage current value may be decreased.

In the above description, a case in which the electronic component 100 is a capacitor having a metal-insulator-metal (MIM) structure in which both the first and second electrodes 121 and 122 include a conductive material has been described. However, the present embodiment is not limited thereto. For example, the electronic component 100 may be/or include a semiconductor device such as a capacitor having a metal-insulator-semiconductor (MIS) structure in which one of the first and second electrodes includes a conductive material and the other includes a semiconductor material.

Figure 2:
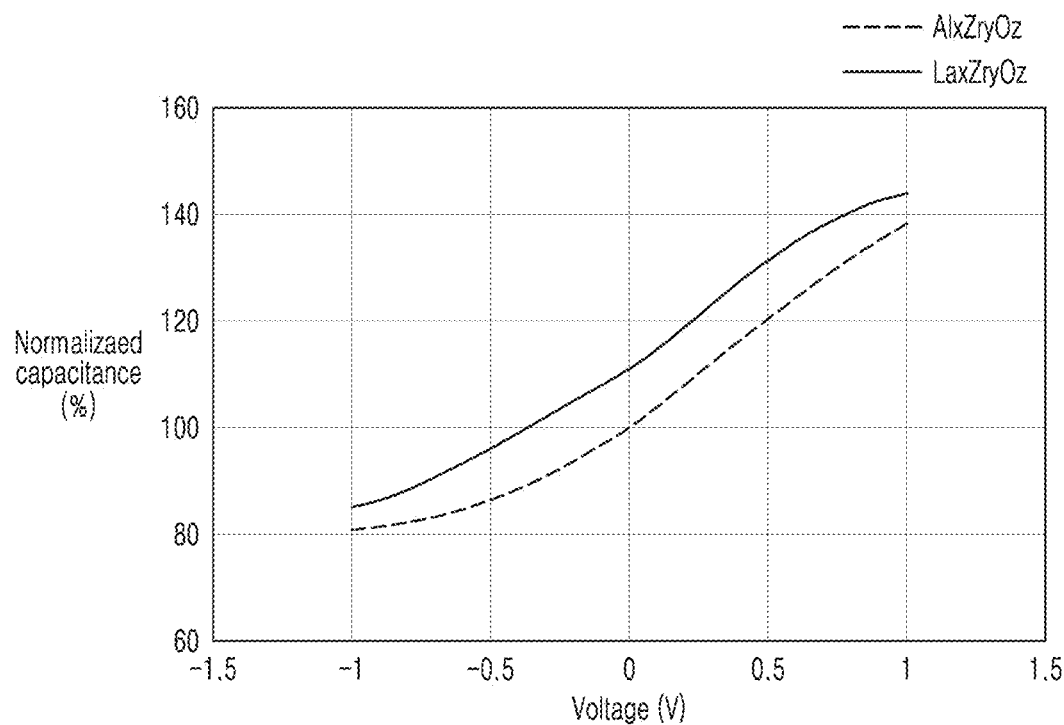
FIG. 2 is a view illustrating comparison results of capacitance measurements of an electronic component including an Al$_x$Zr$_y$O$_z$ leakage current reducing layer and an electronic component including a La$_x$Zr$_y$O$_z$ leakage current reducing layer.
Figure 3:
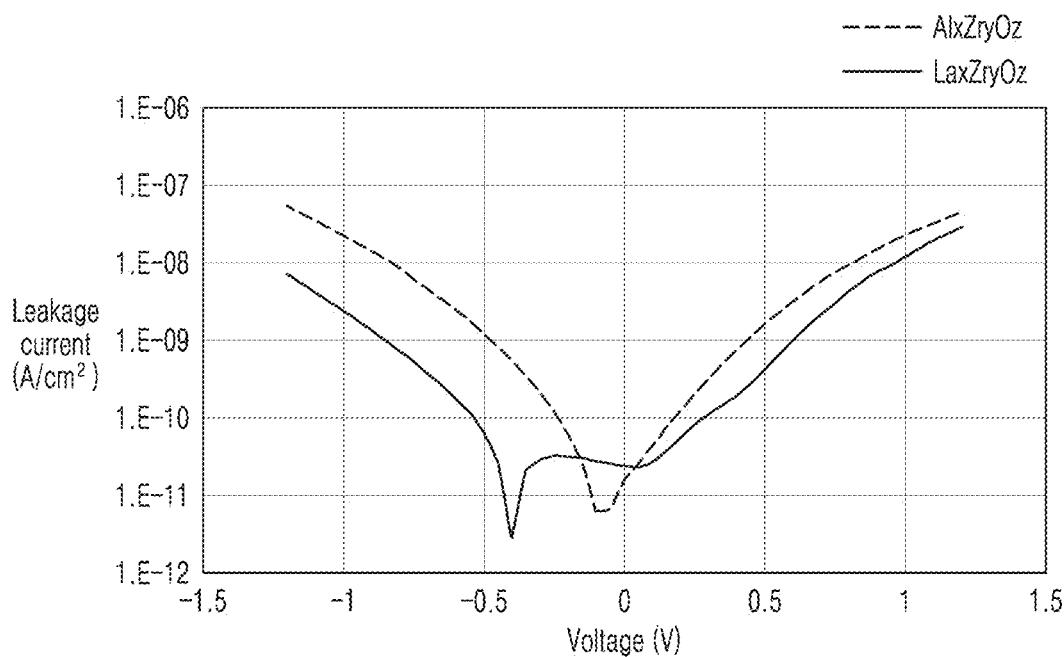
FIG. 3 is a view illustrating comparison results of measurement of leakage current values of an electronic component including an Al$_x$Zr$_y$O$_z$ leakage current reducing layer and an electronic component including a La$_x$Zr$_y$O$_z$ leakage current reducing layer.

FIGS. 2 and 3 show characteristics of a conventional electronic component including an $Al_xZr_yO_z$ leakage current reducing layer and an electronic component according to some example embodiments including a $La_xZr_yO_z$ leakage current reducing layer. In FIGS. 2 and 3, a capacitor having a MIM structure is used as the electronic component.

FIG. 2 is a view illustrating comparison results of capacitance measurements of the conventional electronic component including an $Al_xZr_yO_z$ leakage current reducing layer and the electronic component, according to some example embodiments, including a $La_xZr_yO_z$ leakage current reducing layer. Referring to FIG. 2, it can be seen that the capacitance of the electronic component according to the example embodiments is improved by about 10% compared to the conventional electronic component.

FIG. 3 is a view illustrating comparison results of measurement of leakage current values of a conventional electronic component including an $Al_xZr_yO_z$ leakage current reducing layer and an electronic component, according to some example embodiments, including a $La_xZr_yO_z$ leakage current reducing layer. Referring to FIG. 3, it can be seen that in the electronic component according to the example embodiments, a leakage current is reduced by about two times at a voltage of 1 V compared to the conventional electronic component.

Figure 4:
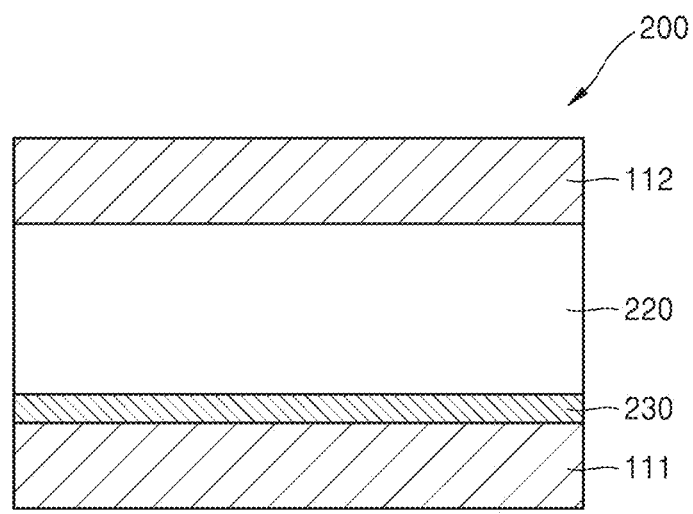
FIG. 4 is a cross-sectional view of an electronic component according to some example embodiments.

FIG. 4 is a cross-sectional view illustrating an electronic component 200 according to some example embodiments. Hereinafter, different content from the above-described example embodiments will be mainly described.

Referring to FIG. 4, the electronic component 200 includes the first and second electrodes 111 and 112 apart from each other, a dielectric layer 220 provided between the first and second electrodes 111 and 112, and a leakage current reducing layer 230 provided between the first electrode 111 and the dielectric layer 220. Because the first and second electrodes 111 and 112 have been described above, a description thereof will not be given herein.

The dielectric layer 220 is similar to the first and second dielectric layers 121 and 122 in FIG. 1 described above. For example, the dielectric layer 220 may include a metal oxide represented by $M_xO_y$ (x and y are natural numbers). M may be one metal element selected from Ca, Sr, Ba, Sc, Y, La, Ti, Zr, Hf, Nb, Ta, Ce, Pr, Nd, Gd, Dy, Yb and/or Lu. The dielectric layer 220 may have a single-layer structure including a single material layer or a multi-layer structure in which a plurality of material layers are stacked.

The leakage current reducing layer 230 may be provided between the first electrode 111 and the dielectric layer 220. The leakage current reducing layer 230 may include a metal oxide represented by $La_x'M_y'O_z'$. M' may be one metal element selected from Ca, Sr, Ba, Sc, Y, La, Ti, Zr, Hf, Nb, Ta, Ce, Pr, Nd, Gd, Dy, Yb and/or Lu. Such metal oxides may have paraelectric properties.

The leakage current reducing layer 230 may be provided between the first electrode 111 and the dielectric layer 220. The leakage current reducing layer 230 may include a metal oxide represented by $La_x\,M_y'O_z'$. M' may be one metal element selected from Ca, Sr, Ba, Sc, Y, Ti, Zr, Hf, Nb, Ta, Ce, Pr, Nd, Gd, Dy, Yb and/or Lu. Such metal oxides may have paraelectric properties.

Figure 5:
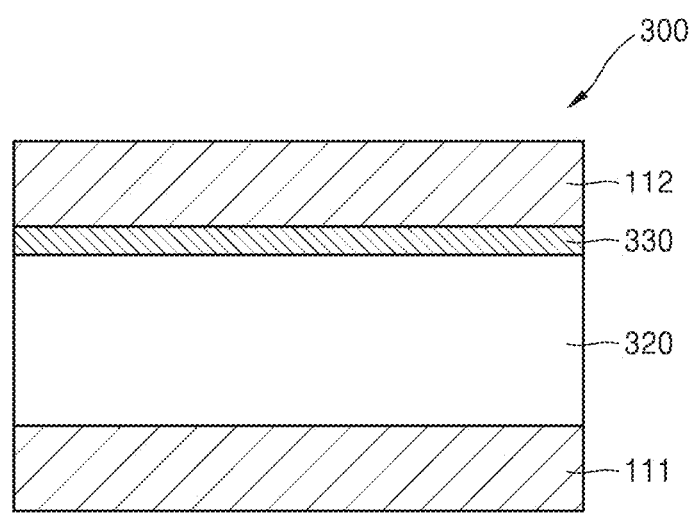
FIG. 5 is a cross-sectional view of an electronic component according to some example embodiments.

FIG. 5 is a cross-sectional view illustrating an electronic component 300 according to some example embodiments.

Referring to FIG. 5, the electronic component 300 includes the first and second electrodes 112 and 112 apart from each other, a dielectric layer 320 provided between the first and second electrodes 111 and 112, and a leakage current reducing layer 330 provided between the second electrode 112 and the dielectric layer 320. Because the first and second electrodes 111 and 112, the dielectric layer 320, and the leakage current reducing layer 330 may be substantially similar to the first and second electrodes 111 and 112, the dielectric layer 220, the leakage current reducing layer 230, as described above, a description thereof will not be given herein.

According to another aspect, a semiconductor apparatus may be provided. The semiconductor apparatus may have a form in which a field effect transistor and a capacitor are electrically connected to each other, and the capacitor may be at least one of the aforementioned electronic component device 100, 200, or 300. The semiconductor apparatus may have a memory characteristic, and may be, for example, DRAM. However, this is merely an example, the semiconductor apparatus is not limited thereto.

Figure 6:
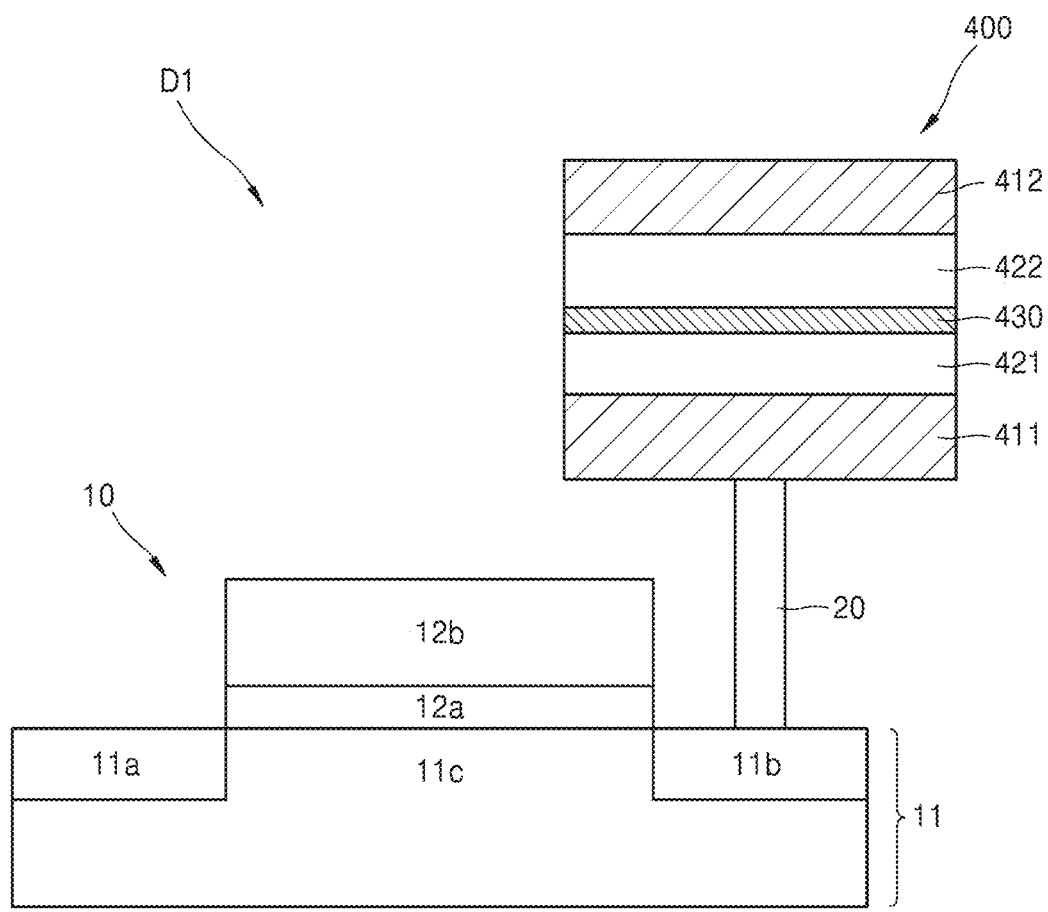
FIG. 6 is a view of a semiconductor apparatus according to some example embodiments.

FIG. 6 is a view of a semiconductor apparatus D1 according to an example embodiment.

Referring to FIG. 6, the semiconductor apparatus D1 may include a field effect transistor 10 and a capacitor 400 electrically connected to each other by the contact 20. The field effect transistor 10 may include a substrate 11 including a channel 11c and a gate electrode 12b arranged to face the channel 11c. A dielectric layer 12a may be provided between the substrate 11 and the gate electrode 12b.

The substrate 11 may include a semiconductor material. The substrate 11 may include, for example, a semiconductor material such as silicon (Si), germanium (Ge), silicon germanium (SiGe), silicon carbide (SiC), gallium arsenide (GaAs), indium arsenide (InAs), and/or indium phosphide (InP), and may be used after being modified into various forms such as silicon on insulator (SOI).

The substrate 11 may include a source 11a, a drain 11b, and a channel 11c electrically connected to the source 11a and the drain 11b. The source 11a may be electrically connected to or in contact with one side of the channel 11c, and the drain 11b may be electrically connected to or in contact with the other side of the channel 11c. For example, the channel 11c may be defined as a substrate area between the source 11a and the drain 11b in the substrate 11.

The source 11a, the drain 11b, and/or the channel 11c may be each independently formed by implanting impurities into different areas of the substrate 11, and in this case, the source 11a, the channel 11c, and the drain 11b may include a substrate material as a base material.

The source 11a and the drain 11b may be formed of and/or include a conductive material. Each of the source 11a and the drain 11b may include, for example, a metal, a metal compound, and/or a conductive polymer. The conductive material may be, for example, an electrode and/or electrode contact.

The channel 11c may be implemented as a material layer (thin film) (not shown) separate from the substrate 11. In this case, for example, the channel 11c may include an oxide semiconductor, a nitride semiconductor, an oxynitride semiconductor, a two-dimensional (2D) material, a quantum dot, and/or an organic semiconductor, as well as a semiconductor material such as Si, Ge, SiGe, III-V, and/or the like. For example, the oxide semiconductor may include InGaZnO and/or the like, the 2D material may include transition metal dichalcogenide (TMD) and/or graphene, and the quantum dot may include a colloidal quantum dot (QD), a nanocrystal structure, and/or the like.

The gate electrode 12b may be arranged on the substrate 11 to face the channel 11c while being apart from the substrate 11. The gate electrode 12b may have, for example, conductivity of 1 Mohm/square or less. The gate electrode 12b may include a conductive material such as a metal, metal nitride, metal carbide, and/or polysilicon. For example, the metal may include aluminum (Al), tungsten (W), molybdenum (Mo), titanium (Ti), and/or tantalum (Ta), and the metal nitride film may include a titanium nitride film (TiN film), and/or a tantalum nitride film (TaN film). The metal carbide may be a metal carbide doped with (or containing) aluminum and/or silicon, and may include TiAlC, TaAlC, TiSiC, and/or TaSiC as some specific examples.

The gate electrode 12b may have a structure in which a plurality of materials are stacked. For example, the gate electrode 12b may be and/or include a stacked structure of a metal nitride layer/metal layer such as TiN/Al, and/or a stacked structure of a metal nitride layer/metal carbide layer/metal layer such as TiN/TiAlC/W. The gate electrode 12b may include a TiN and/or Mo, and the above example may be used in variously modified forms.

A gate insulating layer 12a may be further provided between the substrate 11 and the gate electrode 12b. The gate insulating layer 12a may include a paraelectric material or a high-k dielectric material. The gate insulating layer 12a may include a material having a dielectric constant of about 20 to 70. For example, the gate insulating layer 12a may include silicon oxide, silicon nitride, aluminum oxide, hafnium oxide, zirconium oxide, and/or the like, and/or a 2D insulator such as hexagonal boron nitride (h-BN).

For example, the gate insulating layer 12a may include at least one of silicon oxide ($SiO_2$), silicon nitride ($SiN_x$), and/or the like, and/or may include hafnium oxide ($HfO_2$), hafnium silicon oxide (HfSiO4), lanthanum oxide ($La_2O_3$), lanthanum aluminum oxide (LaAlO3), zirconium oxide ($ZrO_2$), hafnium zirconium oxide ($HfZrO_2$), zirconium silicon oxide (ZrSiO4), tantalum oxide (ZrSiO4), tantalum oxide), titanium oxide ($TiO_2$), strontium titanium oxide ($SrTiO_3$), yttrium oxide ($Y_2O_3$), aluminum oxide ($Al_2O_3$), red scandium tantalum oxide ($PbSc_{0.5}Ta_{0.5}O_3$), red zinc niobate (PbZnNbO$_3$), and/or the like. In addition, the gate insulating layer 12a may include metal nitride oxides such as aluminum oxynitride (AlON), zirconium oxynitride (ZrON), hafnium oxynitride (HfON), lanthanum oxynitride (LaON), yttrium oxynitride (YON), and/or the like, silicate such as ZrSiON, HfSiON, YSiON, LaSiON, and/or the like, and/or aluminate such as ZrAlON, HfAlON, and/or the like. However, these are merely examples, and the gate insulating layer 12a may be not limited thereto. The gate insulating layer 12a may constitute a gate stack together with the gate electrode 12b.

The capacitor 400 may be at least one of the electronic component 100, 200, and/or 300 according to the above-described embodiments. FIG. 6 shows an example case in which the capacitor 400 has the structure of the semiconductor device 100 shown in FIG. 1. In this case, first and second dielectric layers 421 and 422 are provided between first and second electrodes 411 and 412, and a leakage current reducing layer 430 including a metal oxide represented by La$_x$M'$_y$O$^{z'}$ is provided between the first and second dielectric layers 421 and 422. However, this is only an example, and the capacitor 400 may have, as described above, the structure of the semiconductor devices 200 and/or 300 shown in FIG. 4 or FIG. 5. Because the capacitor 400 has been described above, a detailed description thereof will not be given herein.

The field effect transistor 10 and the capacitor 400 may be electrically connected to each other by the contact 20. For example, one of the first and second electrodes 411 and 412 of the capacitor 400 and one of the source and drain 11a and 11b of the field effect transistor 10 may be electrically connected to each other by the contact 20. The contact 20 may include a conductive material, for example, tungsten, copper, aluminum, polysilicon, and/or the like. The arrangement of the capacitor 400 and the field effect transistor 10 may vary. For example, the capacitor 400 may be arranged on the substrate 11 or may be embedded in the substrate 11.

Figure 7:
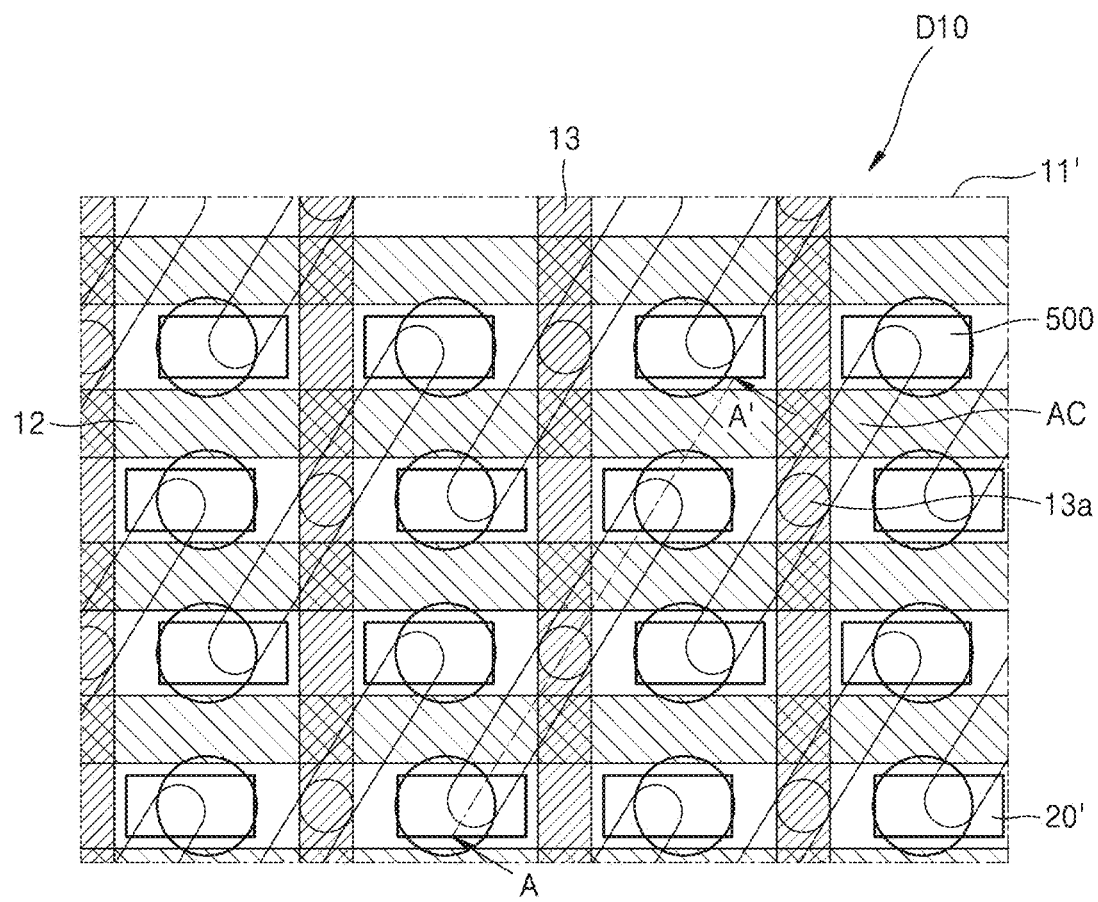
FIG. 7 is a view of a semiconductor apparatus according to some example embodiments.

FIG. 7 is a view of a semiconductor apparatus D10 according to some example embodiments. The semiconductor apparatus D10 shown in FIG. 7 has a structure in which a plurality of capacitors 500 and a plurality of field effect transistors are repeatedly arranged.

Referring to FIG. 7, the semiconductor apparatus D10 may include a field effect transistor having the substrate 11' including a source 11a, a drain 11b, a channel 11c, and the gate stack 12, the contact structure 20' arranged on the substrate 11' so as not to overlap the gate stack 12, and a capacitor 500 arranged on the contact structure 20', and may further include the bit line structure 13 electrically connecting the plurality of field effect transistors.

FIG. 7 illustrates an example of the semiconductor apparatus D10 in which both contact structures 20' and the capacitors 500 are repeatedly arranged in X and Y directions, but the semiconductor apparatus D10 may be not limited thereto. For example, the contact structures 20' may be arranged in the X direction and the Y direction, and the capacitors 500 may be arranged in a hexagonal shape such as a honeycomb structure.

Figure 8:
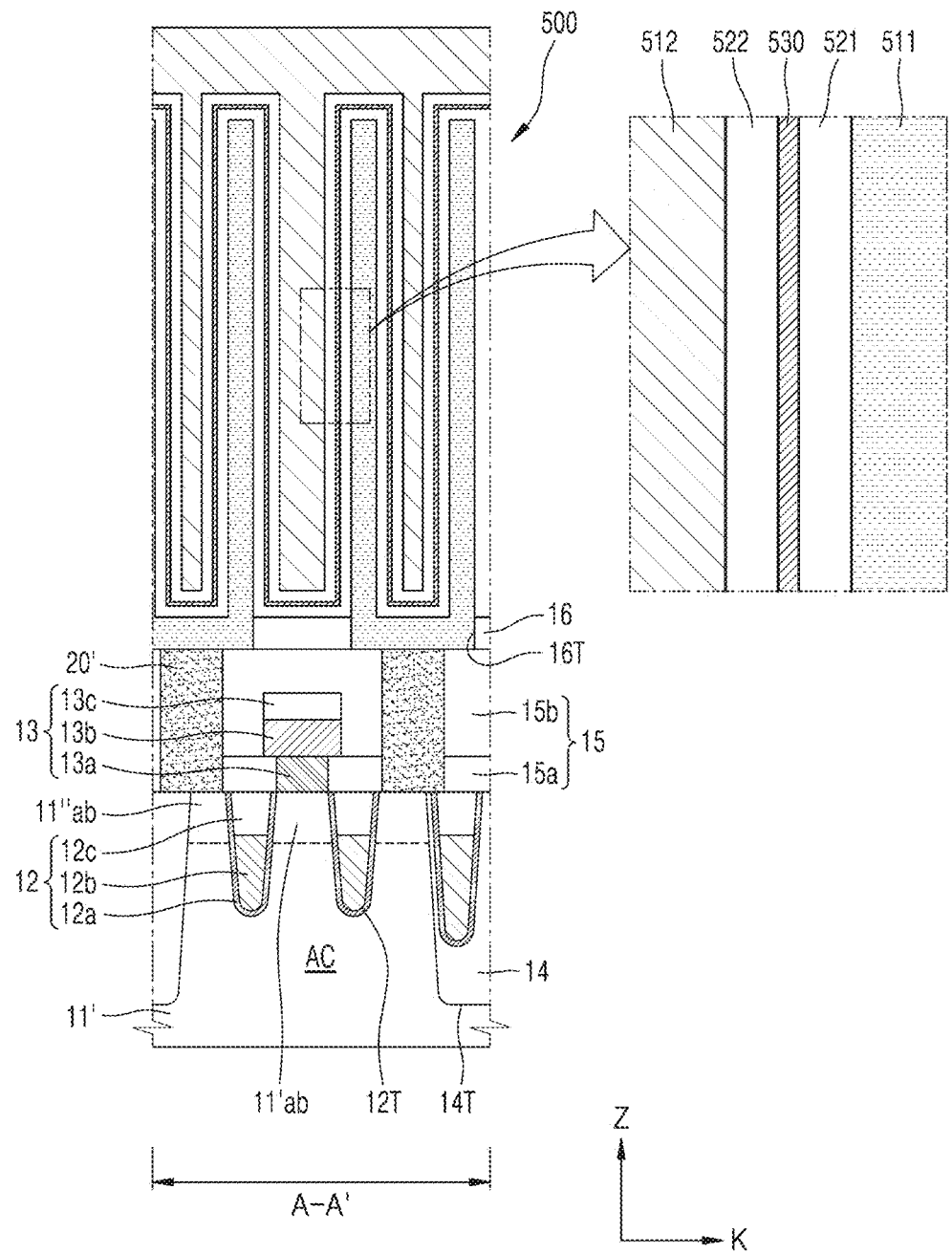
FIG. 8 is a cross-sectional view of the semiconductor apparatus of FIG. 7 taken along line A-A'.

FIG. 8 is a cross-sectional view of the semiconductor apparatus D10 taken along line A-A' of FIG. 7.

Referring to FIG. 8, the substrate 11' may have a shallow trench isolation (STI) structure including a device isolation layer 14. The substrate 11' may be the same and/or substantially similar to the above-described substrate 11. The device isolation layer 14 may be a single layer formed of one type of insulating layer, or a multilayer formed of a combination of two or more types of insulating layers. The device isolation layer 14 may include a device isolation trench 14T in the substrate 11', and the device isolation trench 14T may be filled with an insulating material. The insulating material may include, but is not limited to, fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), tonen silazene (TOSZ), and/or the like.

The substrate 11' may further include an active area AC defined by the device isolation layer 14 and a gate line trench 12T that is parallel to an upper surface of the substrate 11' and is arranged to extend in the X direction. The active area AC may have a relatively long island shape having a short axis and a long axis. The long axis of the active area AC may be arranged in a K direction parallel to the upper surface of the substrate 11' as exemplarily illustrated in FIG. 7. The gate line trench 12T may be arranged to cross the active area AC at a certain depth from the upper surface of the substrate 11' or may be arranged in the active area AC. The gate line trench 12T may also be arranged inside the device isolation trench 14T, and the gate line trench 12T inside the device isolation trench 14T may have a lower bottom surface than the gate line trench 12T of the active area AC.

A first source/drain 11'ab and a second source/drain 11"ab may be arranged in an upper portion of the active area AC located at both sides of the gate line trench 12T. The first source/drain 11'ab and/or the second source/drain 11"ab may be the same and/or substantially similar to the above described source 11a and/or drain 11b.

The gate stack 12 may be arranged inside the gate line trench 12T. For example, the gate stack 12 may include the gate insulating layer 12a, the gate electrode 12b, and/or a gate capping layer 12c sequentially arranged in the gate line trench 12T. The gate insulating layer 12a and the gate electrode 12b may refer to the above description, and the gate capping layer 12c may include silicon oxide, silicon oxynitride, and/or silicon nitride. The gate capping layer 12c may be arranged on the gate electrode 12b to fill the remaining portion of the gate line trench 12T.

The bit line structure 13 may be arranged on the first source/drain 11'ab. The bit line structure 13 may be arranged to be parallel to the upper surface of the substrate 11' and extend in the Y direction. The bit line structure 13 is electrically connected to the first source/drain 11'ab, and may include a bit line contact 13a, a bit line 13b, and a bit line capping layer 13c sequentially stacked on the substrate 11'. For example, the bit line contact 13a may include polysilicon, the bit line 13b may include a metal material, and the bit line capping layer 13c may include an insulating material such as silicon nitride or silicon oxynitride. In FIG. 8, a case in which the bit line contact 13a has a bottom surface at the same level as the upper surface of the substrate 11' is exemplarily shown. However, the bit line contact 13a may extend from the upper surface of the substrate 11' to the inside of a recess (not shown) formed to a certain depth, so that the bottom surface of the bit line contact 13a may be lower than the upper surface of the substrate 11'.

The bit line structure 13 may further include a bit line intermediate layer (not shown) between the bit line contact 13a and the bit line 13b. The bit line intermediate layer may include a metal silicide such as tungsten silicide, and/or a metal nitride such as tungsten nitride. In addition, a bit line spacer (not shown) may be further formed on a sidewall of the bit line structure 13. The bit line spacer may have a single-layer structure or a multi-layer structure, and may include an insulating material such as silicon oxide, silicon oxynitride, or silicon nitride. In addition, the bit line spacer may further include an air space (not shown).

The contact structure 20' may be arranged on the second source/drain 11"ab. The contact structure 20' and the bit line structure 13 may be arranged on different sources/drains on the substrate 11'. The contact structure 20' may have a structure in which a lower contact pattern (not shown), a metal silicide layer (not shown), and an upper contact pattern (not shown) are sequentially stacked on the second source/drain 11"ab. In addition, the contact structure 20' may further include a barrier layer (not shown) surrounding a side surface and a bottom surface of the upper contact pattern. For example, the lower contact pattern may include polysilicon, the upper contact pattern may include a metal material, and the barrier layer may include a conductive metal nitride.

The capacitor 500 may be electrically connected to the contact structure 20' and arranged on the substrate 11'. The capacitor 500 may be one of the electronic components 100, 200, and/or 300, and/or the capacitor 400, according to the above-described embodiments. FIG. 8 shows an example case in which the capacitor 500 has the structure of the semiconductor device 100 shown in FIG. 1.

For example, the capacitor 500 may include a first electrode 511 electrically connected to the contact structure 20', a second electrode 512 provided to be apart from the first electrode 511, first and second dielectric layers 521 and 522 provided between the first and second electrodes 511 and 512, a leakage current reducing layer 530 including a metal oxide represented by $La_xM'_yO_z$, provided between the first and second dielectric layers 521 and 522. However, this is only an example, and the capacitor may have the structure of the semiconductor devices 200 and 300 shown in FIG. 4 or FIG. 5.

The interlayer insulating layer 15 may be further arranged between the capacitor 500 and the substrate 11'. The interlayer insulating layer 15 may be arranged in a space between the capacitor 500 and the substrate 11' in which other structures are not arranged. For example, the interlayer insulating layer 15 may be arranged to cover wiring and/or electrode structures such as the bit line structure 13 on the substrate 11', the contact structure 20', and the gate stack 12. For example, the interlayer insulating layer 15 may surround a wall of the contact structure 20'. The interlayer insulating layer 15 may include a first interlayer insulating layer 15a surrounding the bit line contact 13a and a second interlayer insulating layer 15b covering side surfaces and/or upper surface of the bit line 13b and the bit line capping layer 13c.

The first electrode 511 of the capacitor 500 may be arranged on the interlayer insulating layer 15, specifically, on the second interlayer insulating layer 15b. In addition, when a plurality of capacitors 500 are arranged, bottom surfaces of a plurality of first electrodes 511 may be separated by an etch stop layer 16. For example, the etch stop layer 16 may include an opening 16T, and a bottom surface of a first electrode 100 of the capacitor 500 may be arranged in the opening 16T.

Figure 9:
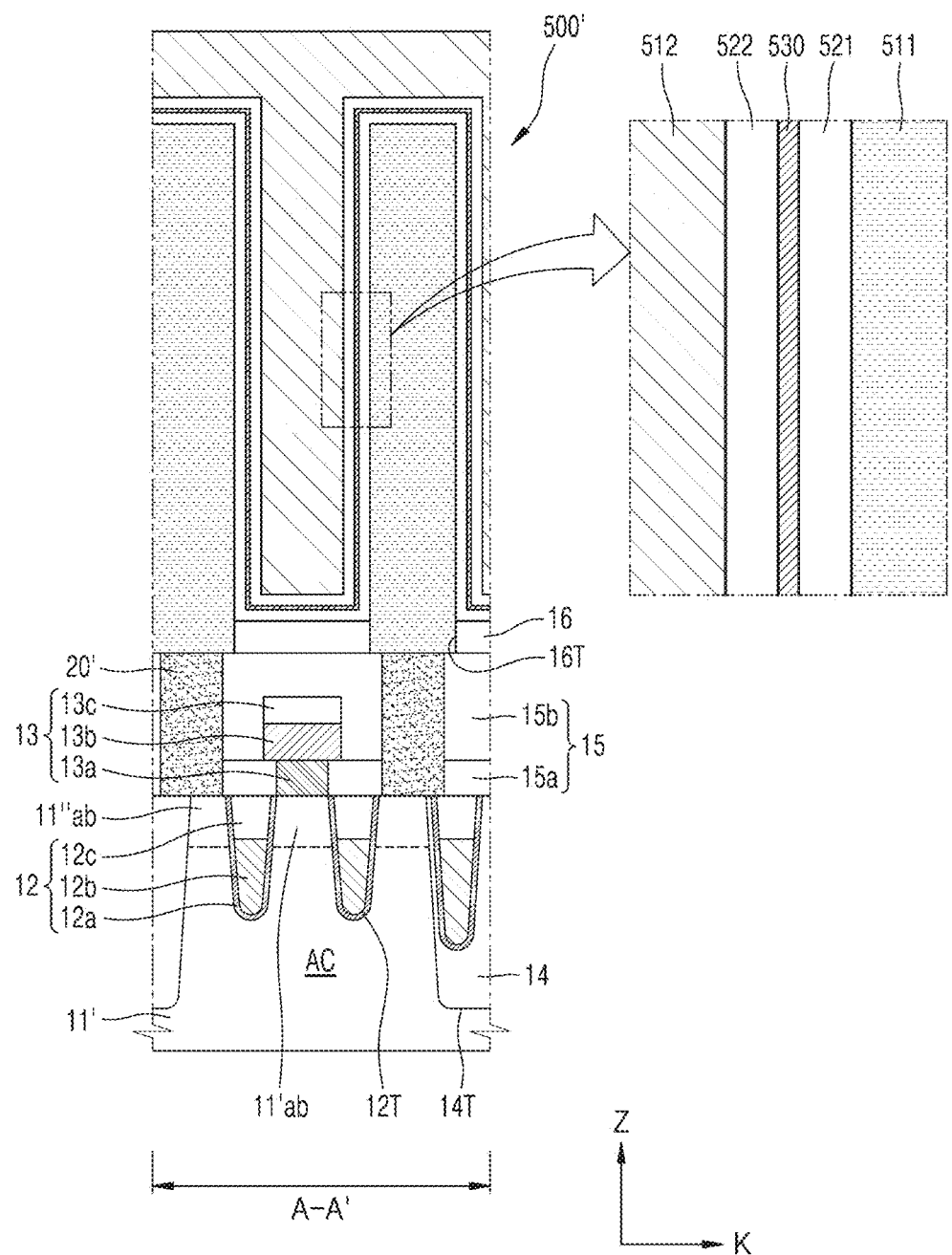
FIG. 9 is a view of a semiconductor apparatus according to some example embodiments.

The first electrode 511 may have a cylinder shape with a closed bottom and/or a cup shape, as shown in FIG. 8, and/or, in another example, as in a capacitor 500' illustrated in FIG. 9, the first electrode 511 may have a pillar shape such as a cylinder, a square pillar, and/or a polygonal pillar extending in a vertical direction (Z direction). The capacitor 500 may further include a support portion (not shown) for preventing (e.g., mitigating the potential for) the first electrode 511 from being tilted and/or collapsed, and the support portion may be arranged on a sidewall of the first electrode 511.

The above-described semiconductor apparatus D10 may be manufactured with reference to a conventional method known in the art. For example, the semiconductor apparatus D10 may be manufactured by including operations of i) to xvi) below.

i) Forming the device isolation trench 14T in the substrate 11', and forming the device isolation layer 14 in the device isolation trench 14T (Defining the active area AC of a substrate 102 by the device isolation layer 14 and/or the device isolation trench 14T), ii) Filling the inside of the isolation trench 14T with an insulating material, iii) Implanting impurity ions into the substrate 11' to form the first source/drain 11'ab and the second source/drain 11"ab in an upper area of the active area AC, iv) Forming the gate line trench 12T in the substrate 11', v) Forming the gate insulating layer 12a, the gate electrode 12b, and the gate capping layer 12c inside the gate line trench 12T, vi) Forming the first interlayer insulating layer 15a on the substrate 11', and forming an opening (not shown) exposing an upper surface of the first source/drain 11'ab, vii) Forming the bit line structure 13 electrically connected to the first source/drain 11'ab on the opening of vi), viii) Forming the second interlayer insulating layer 15b covering an upper surface and a side surface of the bit line structure 13, ix) Forming an opening (not shown) in the first and second interlayer insulating layers 15a and 15b to expose an upper surface of the second source/drain 11"ab, x) Forming the contact structure 20' electrically connected to the second source/drain 11"ab on the opening of ix), x i) Forming the etch stop layer 16 and a mold layer (not shown) on the second interlayer insulating layer 15b and the contact structure 20', x ii) Forming an opening (not shown) in the etch stop layer 16 and the mold layer (not shown) to expose an upper surface of the contact structure 20', x iii) Forming the first electrode 511 to cover an inner wall (to cover bottom and side surfaces) of the opening of x ii), x iv) Removing the mold layer (not shown), x v) Forming the first dielectric layer 521, a leakage current reducing layer 530, and the second dielectric layer 522 on the first electrode 511, and x vi) Forming the second electrode 512 on the second dielectric layer 522.

The type and/or order of each operation described above is not limited, and may be appropriately adjusted, and some may be omitted and/or added. In addition, a deposition process, a patterning process, an etching process, etc. known in the art may be used to form the components in each operation. For example, an etch-back process may be applied when forming an electrode. In operation v), the gate electrode 12b may be formed by forming a conductive layer on the gate insulating layer 12a and then removing an upper portion of the conductive layer by a certain height through an etch-back process. In addition, in operation x iii), the first electrode 511 may also be manufactured in a structure including a plurality of first electrodes 511 by forming an electrode to cover all of an upper surface of the mold layer and the bottom and side surfaces of the opening and then removing a portion of the electrode on the upper surface of the mold layer by an etch-back process. As another example, a planarization process may be applied. For example, in operation v), the gate capping layer 12c may be formed by filling the remaining portion of the gate line trench 12T with an insulating material and then planarizing the insulating material until the upper surface of the substrate 11' is exposed.

According to another aspect, the above-described electronic component 100, 200, and/or 300 and/or the semiconductor apparatuses D1 and/or D10 may be applied to various electronic devices. For example, the above-described electronic component 100, 200, and/or 300 and/or the semiconductor apparatuses D1 and/or D10 may be applied as logic devices or memory devices in various electronic devices. For example, the electronic component 100, 200, and/or 300 and the semiconductor apparatuses D1 and D10 may be used for arithmetic operations, program execution, and temporary data retention in electronic devices such as mobile devices, computers, laptops, sensors, network devices, or neuromorphic devices. A semiconductor device and a semiconductor apparatus according to embodiments may be useful for electronic devices in which the amount of data transmission is large and data transmission is continuously performed.

Figure 10:
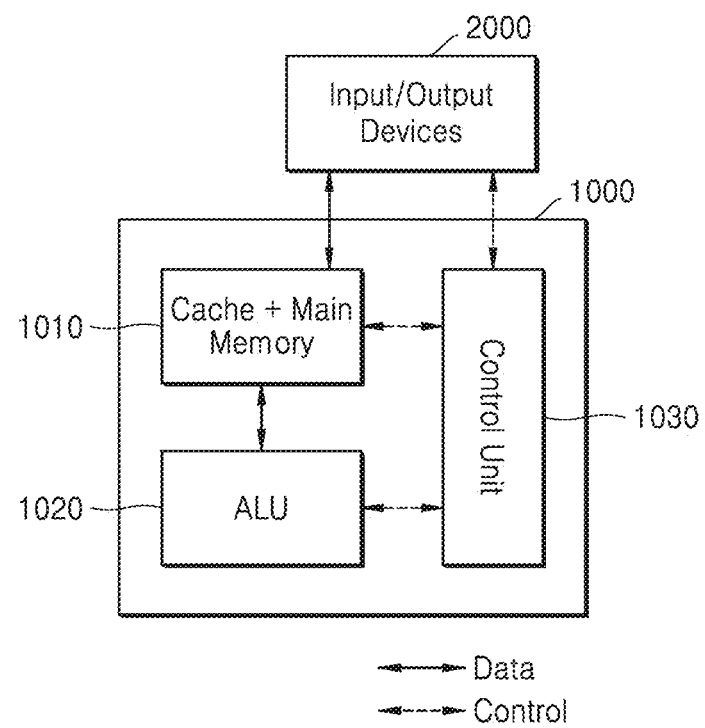
FIG. 10 is a conceptual diagram of a device architecture applicable to an electronic device according to some example embodiments.
Figure 11:
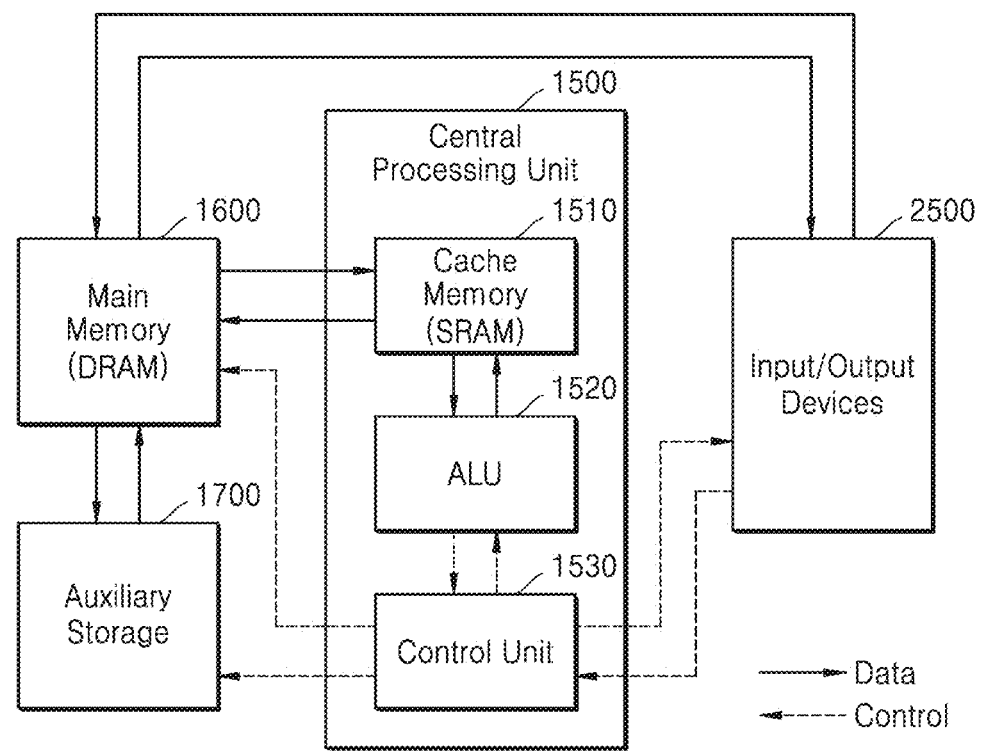
FIG. 11 is a conceptual diagram of a device architecture applicable to an electronic device according to some example embodiments.

FIGS. 10 and 11 are conceptual diagrams schematically illustrating a device architecture applicable to an electronic device according to some example embodiments.

Referring to FIG. 10, a device architecture 1000 may include a memory unit 1010, an arithmetic logic unit (ALU) 1020, and a control unit 1030. The memory unit 1010, the ALU 1020, and the control unit 1030 may be electrically connected to each other. For example, the device architecture 1000 may be implemented as a single chip including the memory unit 1010, the ALU 1020, and the control unit 1030. In more detail, the memory unit 1010, the ALU 1020, and the control unit 1030 may be interconnected by a metal line in an on-chip to directly communicate with each other. The memory unit 1010, the ALU 1020, and the control unit 1030 may be integrated monolithically on one substrate to configure one chip. An input/output device 2000 may be connected to the device architecture 1000. In addition, the memory unit 1010 may include both a main memory and a cache memory. This device architecture 1000 may be an on-chip memory processing unit. The memory unit 1010, the ALU 1020, and/or the control unit 1030 may each independently include the aforementioned semiconductor device.

Referring to FIG. 11, a cache memory 1510, an ALU 1520, and a control unit 1530 may constitute a central processing unit (CPU) 1500, and the cache memory 1510 may be formed of static random access memory (SRAM). Separately from the CPU 1500, a main memory 1600 and an auxiliary storage 1700 may be provided. The main memory 1600 may be dynamic random access memory (DRAM) and may include the aforementioned semiconductor device. In some cases, the device architecture may be implemented in a form in which computing unit devices and memory unit devices are adjacent to each other in a single chip without distinction of sub-units.

According to the above example embodiments, by providing a leakage current reducing layer including $La_xM'_yO_z$, metal oxide in a dielectric layer, electronic component capable of increasing capacitance while reducing a leakage current may be realized. Such an electronic component may be applied to a semiconductor apparatus such as DRAM, and an electronic device such as a mobile device, a computer, a laptop, a sensor, a network device, and a neuromorphic device. Although some example embodiments have been described above, this is merely examples, and various modifications are possible therefrom by one of ordinary skill in the art.

It should be understood that the example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An electronic component comprising:
 a first electrode;
 a second electrode apart from the first electrode; and
 a dielectric structure between the first electrode and the second electrode, the dielectric structure including
  a dielectric layer including a metal oxide represented by $M_xO_y$, where M is at least one of Ca, Sr, Ba, Sc, Y, La, Ti, Zr, Hf, Nb, Ta, Ce, Pr, Nd, Gd, Dy, Yb, or Lu, and
  a leakage current reducing layer including a metal oxide represented by $La_x'M'_y'O_z'$, where M' is at least one of Ca, Sr, Ba, Sc, Y, Ti, Zr, Hf, Nb, Ta, Ce, Pr, Nd, Gd, Dy, Yb, or Lu,
 wherein a thickness of the leakage current reducing layer is within a range of 0.1 Å to 4.5 Å.

2. The electronic component of claim 1, wherein
 the dielectric layer comprises first and second dielectric layers, and
 the leakage current reducing layer is between the first dielectric layer and the second dielectric layer.

3. The electronic component of claim 1, wherein the leakage current reducing layer is between the first electrode and the dielectric layer.

4. The electronic component of claim 1, wherein the leakage current reducing layer is between the second electrode and the dielectric layer.

5. The electronic component of claim 1, wherein a total thickness of the dielectric structure is about 50 Å or less.

6. The electronic component of claim 1, wherein the dielectric layer has at least one of a single-layer structure.

7. The electronic component of claim 1, wherein the dielectric layer has a multi-layer structure in which different materials are stacked.

8. The electronic component of claim 1, wherein each of the first and second electrodes comprises at least one of W, TaN, TiN, $RuO_{1-3}$, NbN, Sc, Al, Mo, MON, Pd, Pt, Sn, La, or Ru.

9. The electronic component of claim 1, wherein one of the first and second electrodes comprises a semiconductor material.

10. A semiconductor apparatus comprising:
 a field effect transistor; and
 a capacitor electrically connected to the field effect transistor, the capacitor comprising
  a first electrode,
  a second electrode apart from the first electrode, and
  a dielectric structure between the first electrode and the second electrode, the dielectric structure including
   a dielectric layer including a metal oxide represented by $M_xO_y$, where M is at least one of Ca, Sr, Ba, Sc, Y, La, Ti, Zr, Hf, Nb, Ta, Ce, Pr, Nd, Gd, Dy, Yb, and Lu, and
   a leakage current reducing layer including a metal oxide represented by $La_xM'_y'O_z'$, where M' is at least one of Ca, Sr, Ba, Sc, Y, Ti, Zr, Hf, Nb, Ta, Ce, Pr, Nd, Gd, Dy, Yb, and Lu, wherein a thickness of the leakage current reducing layer is within a range of 0.1 Å to 4.5 Å.

11. The semiconductor apparatus of claim 10, wherein the field effect transistor comprises:
a channel layer between a source and a drain;
a gate layer on the channel layer; and
a gate electrode on the gate layer.

12. The semiconductor apparatus of claim 10, wherein the dielectric layer comprises first and second dielectric layers, and
the leakage current reducing layer is between the first dielectric layer and the second dielectric layer.

13. The semiconductor apparatus of claim 10, wherein the leakage current reducing layer is between the dielectric layer and at least one of the first electrode or the second electrode.

14. The semiconductor apparatus of claim 10,
wherein a total thickness of the dielectric structure is about 50 Å or less.

15. The semiconductor apparatus of claim 10,
wherein each of the first and second electrodes comprises at least one of W, TaN, TiN, $RuO_{1-3}$, NbN, Sc, Al, Mo, MON, Pd, Pt, Sn, La, or Ru.

16. An electronic device comprising a plurality of the semiconductor apparatus of claim 10.

* * * * *